US005498769A

United States Patent [19]
Samoto

[11] Patent Number: 5,498,769
[45] Date of Patent: Mar. 12, 1996

[54] METHOD FOR THERMALLY TREATING RESIST FILM AND FORMING UNDERCUT PATTERN

[75] Inventor: Norihiko Samoto, Tokyo, Japan

[73] Assignee: NEC Corporation, Tokyo, Japan

[21] Appl. No.: 353,990

[22] Filed: Dec. 6, 1994

Related U.S. Application Data

[63] Continuation of Ser. No. 170,870, Dec. 21, 1993, abandoned.

[30] Foreign Application Priority Data

Dec. 21, 1992 [JP] Japan ..................................... 4-340072

[51] Int. Cl.$^6$ ....................................................... G03F 7/00
[52] U.S. Cl. ........................ 430/327; 430/311; 430/330
[58] Field of Search ............................. 430/30, 327, 311, 430/330

[56] References Cited

U.S. PATENT DOCUMENTS 5,203,958  4/1993  Arai ......................................... 156/643
5,217,834  6/1993  Higaki ....................................... 430/30

FOREIGN PATENT DOCUMENTS 2239613  9/1990  Japan.

*Primary Examiner*—Kathleen Duda
*Attorney, Agent, or Firm*—Sughrue, Mion, Zinn, Macpeak & Seas

[57] ABSTRACT

A method for thermally treating a resist film for forming an undercut pattern therein includes forming internally in the resist film a distribution of temperatures falling from the surface of the resist film toward an interface between the resist film and the substrate. The heat source and the resist film are brought to a state wherein they are located closely to each other while maintaining an untouching space. This state is kept for a predetermined time period, and the resist film and the heat source are caused to be spaced away from each other to a location wherein the resist film is free from being influenced by the heat source. Only by having a desired pattern exposed and subsequently developed, it is possible to form the resist pattern in an undercut form in the resist film which is useful as an underlying pattern in a lift-off process. Far-ultraviolet rays may be applied on an entire surface of the resist film after the developing process so as to enhance thermal resistance characteristics of the resist patter in the resist film.

8 Claims, 4 Drawing Sheets

5,498,769

METHOD FOR THERMALLY TREATING RESIST FILM AND FORMING UNDERCUT PATTERN

This is a Continuation of application Ser. No.08/170,870, filed Dec. 21, 1993 now abandoned.

BACKGROUND OF THE INVENTION

(1) Field of the Invention

The present invention relates to a method for thermally treating a photoresist film, and more particularly to a method for forming in a resist film, which is sensitive to ultraviolet (UV) rays, a pattern in an undercut form upon the subsequent exposure and development process.

(2) Description of the Related Art

As a method for forming a metal electrode by a photolithography technique using a resist film, a Japanese Patent Application Kokai Publication No. Hei 2 -39613 has disclosed "a method for forming a fine pattern", which is shown in FIG. 1. As shown therein, a resist film 12 is deposited on a surface of a substrate 11 and this film has been selectively exposed in a desired pattern. A back surface of the substrate 11 is held on a vacuum chuck 13 which is maintained at a temperature of 20°C. The resist film 12 is placed in a vessel 14 equipped with an agitator and a temperature controller and is positioned in such a way that the resist film 12 is in contact with a surface of the developing solution 15. It is so arranged that the resist film 12 is given temperature differences in the direction of the thickness of the film and that, after the development, an opening is formed in an undercut (overhang) form.

In the conventional method described above, as a method for forming the pattern in an undercut form in the resist film during the developing process, the temperature differences are created between the developing solution touching the surface of the resist film and the vacuum chuck holding the substrate. Due to the facts that, during the developing, the developing solution touching the resist film is kept at a constant temperature, that the thickness of the resist film is normally about few μm and that the time required for the developing is in a matter of minute, the temperature of the surface of the resist film touching the developing solution becomes substantially the same as that of the developing solution itself. Therefore, a problem is that, if the pattern in an undercut form is attempted to be formed, it is necessary that the developing process be limited to a very short period of time.

SUMMARY OF THE INVENTION

It is, therefore, an object of the invention to overcome the problem existing in the conventional method explained above and to provide a method for forming a resist pattern in an undercut form in a resist film sensitive to ultraviolet rays upon the exposure and development of the resist film.

According to one aspect of the invention, there is provided a method for thermally treating a resist film formed on a substrate, the method comprising:

placing a heat source over a surface of the resist film with an untouching space left therebetween; and forming internally in the resist film a distribution of temperatures falling from the surface of the resist film toward an interface between the resist film and the substrate.

If it is desired to make a further reduction in the dimensions of an upper opening portion and a lower opening portion to be formed after the exposure and development process, an optional step in which the resist film is given an ordinary heating (baking) below a glass transition temperature of the resist film may precede the above thermal treatment of the resist film. The "ordinary heating" herein refers to a heat treatment which does not create a temperature distribution on purpose. After the thermal treatment, a desired pattern is transferred onto the resist film using ultraviolet rays and, when this is developed, the resist pattern in a desired undercut form is obtained. Also, optionally, after the development, the overall surface of the resist film may be exposed to far-ultraviolet rays to enhance the thermal resistance characteristics of the resist film.

According to the present invention, the temperature distribution formed within the resist film during the thermal treatment of the resist film causes variations in the speed with which the resist film dissolves at its various points in the developing solution during the developing process. This phenomenon in a novolak type resist constituted by a novolak resin and naphthoquinonediazido as a sensitizer is considered attributable to the following two factors. Either by exposure to rays or heating to a temperature above 130° C., the diazido radical turns to ketene by eliminating nitride ($N_2$) and then turns to indene-carboxylic acid by reacting with residual water content in the resist. This indene-carboxylic acid lowers the resistance in the novolak type resist in the developing solution. However, when the residual water content in the resist is small, the ketene does not change to indene-carboxylic acid but links with a novolak resin or reacts with naphthoquinonediazido whereby the novolak resin becomes eluting to the developing solution. When heated at a temperature above 180° C., the novolak resin undergoes the bridge formation, that is, a liquidation phenomenon in the novolak resin in the developing solution due to an increase in molecular weight therein. Therefore, with the lowering of the residual water content in the resist by heating at a temperature above 130° C. or with the bridge formation in the novolak resin by heating at a temperature above 180° C., or with a combination of these two phenomena, it is made possible to render the novolak resist less soluble in the developing solution. In this case, the heating temperatures are set higher at the side of the surface of the resist film than at the interface between the resist film and the substrate, so that the dissolving speed in the resist film becomes progressively larger toward the interface between the resist film and the substrate. Therefore, absorption of ultraviolet rays in the resist film is larger at its surface and smaller at the interface between the resist film and the substrate. This fact indicates that, by forming the temperature distribution in the resist film in such a way that the absorption distribution of ultraviolet rays may be compensated thereby, it is possible to realize a pattern in a vertical edge form or a pattern in an undercut form on the substrate when the pattern in a desired form is exposed and subsequently developed. Also, since the temperature distribution can be controlled by thicknesses of the resist film, it is possible to control the dimension of the opening on the resist film and the dimension of the opening at the resist-substrate interface. respectively.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Figure 1:
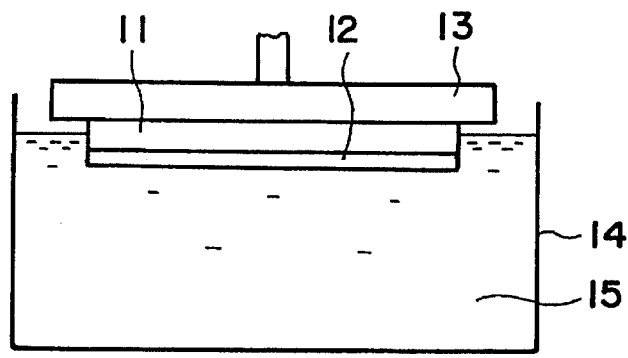
FIG. 1 is a diagrammatic sectional view showing a conventional system for forming a metal electrode using a resist film.
Figure 2:
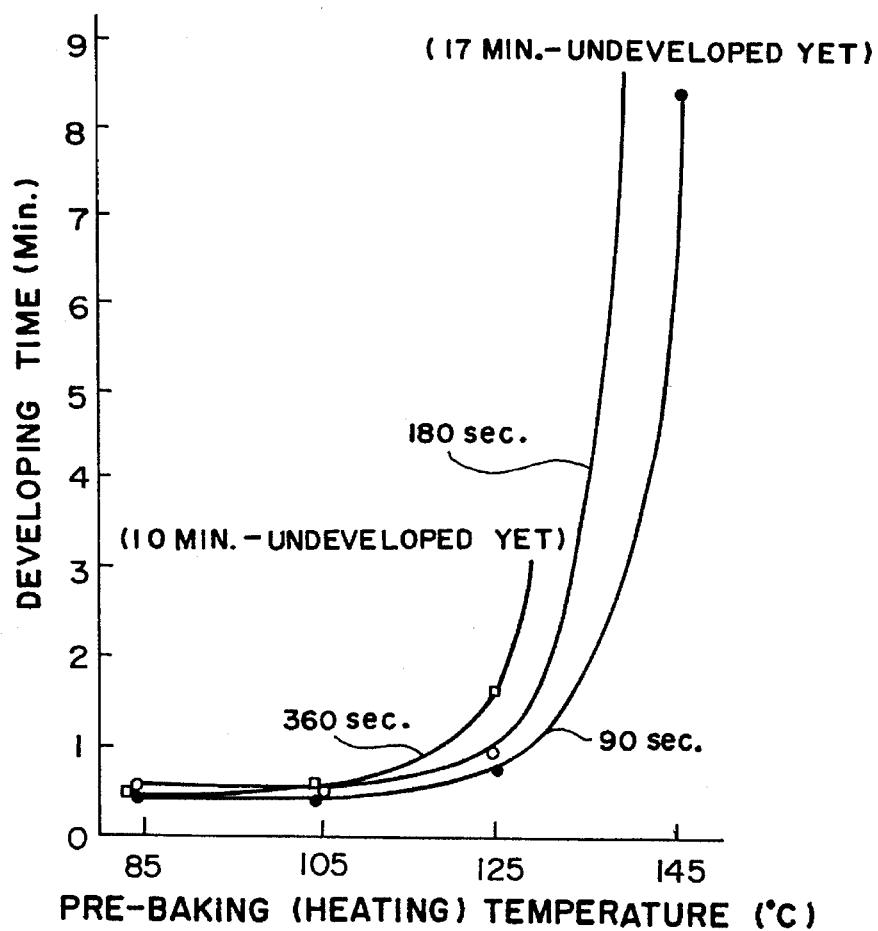
FIG. 2 is a graph showing the time required for developing the resist film and the temperature dependency characteristics according to the embodiment of the invention.
Figure 3:
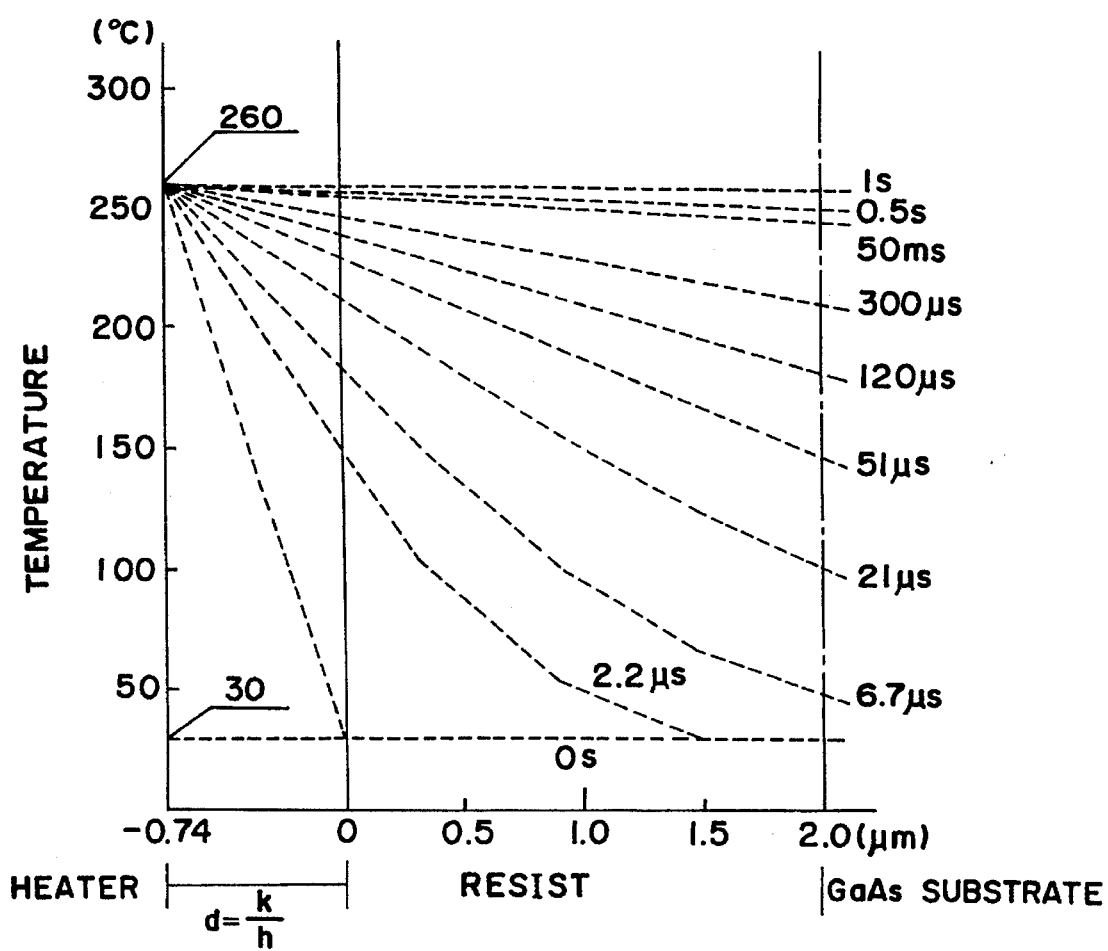
FIG. 3 is a graph showing a temperature distribution within the resist film obtained through a Schmit graphical solution according to the embodiment of the invention.

Now, a preferred embodiment of the invention is described with reference to the drawings. FIG. 2 gives curves showing developing characteristics in a method according to the invention. FIG. 3 shows a temperature distribution within a resist film. FIGS. 4A–4F show, in schematic sectional views, process steps for forming a resist film structure.

FIG. 2 shows the time required for developing the resist film and the temperature dependency characteristics therein. The resist film used is an AZ-1370SF resist (a product available from Hoechst Japan) having a thickness of 2 μm. The resist has been experimented for three different time periods, namely, 90 seconds, 180 seconds, and 360 seconds. It has shown that, under the pre-baking at a temperature above 105° C., the higher the temperature and longer the time for the pre-baking, the less easy to develop the resist film. Therefore, by forming the varying temperature distribution within the resist film during the pre-baking of the resist film, it is possible to have an undercut form realized therein when developed after the exposure.

FIG. 3 shows the result of a simulation by a Schmit graphical solution conducted for estimating the baking time required for the formation of the temperature distribution within the resist film 2 μm thick when the resist film 2 μm thick was applied and formed on a gallium arsenide (GaAs) substrate (350 μm thick). Assuming that a hot plate of 260° C. is imaginarily spaced 0.74 μm from a surface of the resist film and that the substrate temperature prior to the baking was 30° C., it follows according to the graph that there will be formed a temperature distribution having a temperature difference of about 10° C. within the wafer by the baking thereof for one second. According to the graph, for the baking of the same for 0.5 seconds, there will be a temperature distribution having a temperature difference of about 17° C. within the wafer. In this simulation, the calculation was made by using $0.16 \times 10^{-2}$ W/cm.°C. as a coefficient of thermal conductivity for the resist film and 0.46 W/cm.°C. as a coefficient of thermal conductivity for the GaAs substrate.

Thus, if the temperature distribution is formed after the surface of the resist film has been heated to a high temperature at least above 105° C., it is possible to accomplish the formation of an undercut as desired.

Now, based on the above knowledge and on the precondition that the baking is conducted for one second for providing the temperature difference larger than 10° C. within the resist film having a thickness of about 2 μm, explanation is made with reference to FIGS. 4A–4F as to the process steps involved in the formation of the undercut.

Figure 4A:
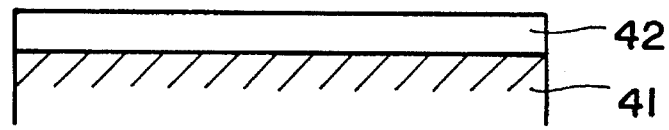
FIGS. 4A–4F are diagrammatic sectional views for showing the sequential steps for forming a resist film structure according to the embodiment of the invention.
Figure 4B:
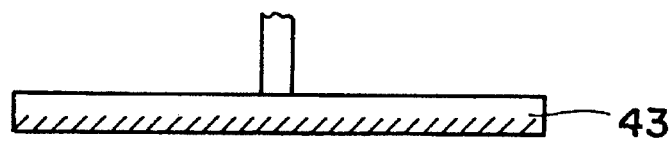
Figure 4B:
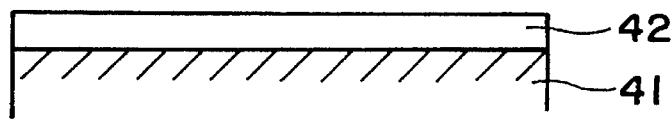
Figure 4C:
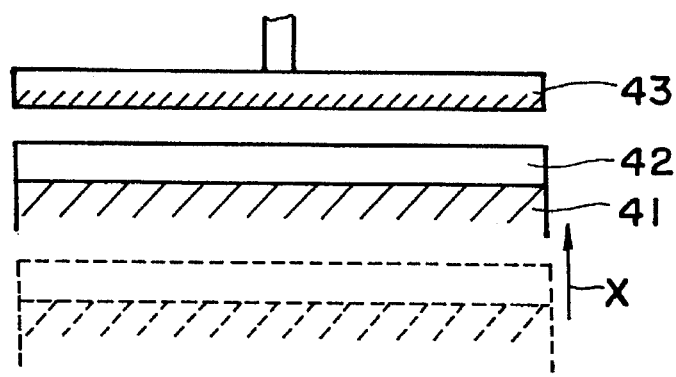
Figure 4D:
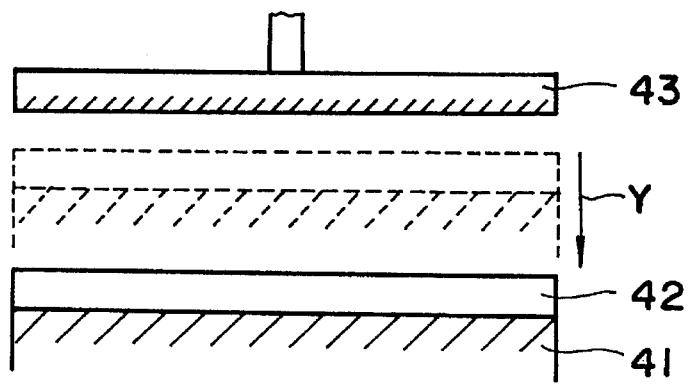
Figure 4E:
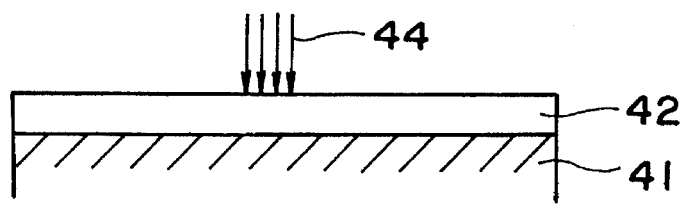
Figure 4F:
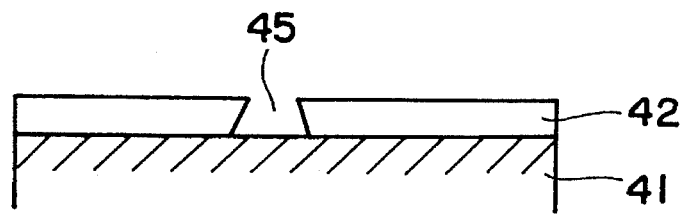

First, as shown in FIG. 4A, a resist film 42 (for example, the AZ-1370SF, a product available from Hoechst Japan) is applied on a substrate 41 to a desired thickness (for example, 2 μm). Then, as shown in FIG. 4B, under the hot plate 43 heated to a temperature above 105° C. (for example, 350° C.), the substrate 41 on which the resist film 42 has been applied is positioned in such a way that a surface of the resist film 42 faces the hot plate 43. Thereafter, as seen in FIG. 4C, the substrate 41 having the resist film 42 thereon is caused to approach toward the hot plate 43 as shown by an arrow X at an average speed of 30 cm/sec but only to a position at which this substrate 41 does not touch the hot plate 43 (with a space of, for example, 200 μm between the hot plate and the resist). The substrate 41 in this state is held there for less than one second (for example, 0.5 seconds). Next, as seen in FIG. 4D, the substrate 41 having the resist film 42 thereon is caused to move away from the hot plate 43 as shown by an arrow Y at an average speed of 30 cm/sec. Then, as shown in FIG. 4E, after the completion of the baking, a desired pattern is exposed on the resist film 42 by ultraviolet rays and, as shown in FIG. 4F, the subsequent development thereof results in the formation of a desired undercut pattern 45 on the substrate 41.

The exposure process was carried out by using a mask pattern 0.5 μm wide and by varying distances between the hot plate (set at 350° C.) and the resist film, and the dimensions of an upper opening portion and a bottom opening portion of the undercut opening obtained in the AZ-1370SF resist 1.8 μm thick are as shown in TABLE 1.

TABLE 1

| Distances (μm) | 150 | 200 | 400 | 800 |
|---|---|---|---|---|
| Upper opening portion $L_t$ (μm) | 0.88 | 0.95 | 1.10 | 1.24 |
| Bottom opening portion $L_b$ (μm) | 1.10 | 1.27 | 1.48 | 1.70 |
| Difference $(L_t-L_b)$ (μm) | 0.22 | 0.32 | 0.38 | 0.46 |

In the above table, the measurement errors in the distances may be ±25 μm and those in the dimensions of the opening portions may be ±0.12μ. Also, the dimensions of the opening portions when the temperatures of the hot plate are 230° C. and 260° C. will be as given in TABLE 2.

TABLE 2

| | Hot plate temperature (°C.) | | | |
|---|---|---|---|---|
| | 230 | | 260 | |
| Distance (μm) | 50 | 50 | 50* | 100 |
| Upper opening portion $L_t$ (μm) | 1.25 | 1.00 | 0.84 | 1.70 |
| Bottom opening portion $L_b$ (μm) | 1.75 | 1.10 | 1.00 | 1.80 |
| Difference $(L_t-L_b)$ (μm) | 0.50 | 0.10 | 0.16 | 0.10 |

(*with baking at 85° C.)

It can be appreciated from TABLE 2 above that, although the dimension of the upper opening portion and that of the bottom opening portion cannot be set or controlled independently from each other, it is possible to form an undercut pattern in a desired dimension at the upper opening portion or the bottom opening portion by appropriately selecting the temperatures of the hot plate or the distances between the hot plate and the resist, or by performing preheating (ordinary heating) at a temperature of about 85° C.

In the above, the present invention has been described and illustrated in detail with reference to the preferred embodiment. It is to be understood that the description and the illustration are by way of examples only and are not to be taken by way of limitations since many modifications can be made within the spirit and scope of the invention defined in the appended claims.

For example, depending on the necessity, prior to the procedure for the formation of the temperature distribution within the resist film 42, a pre-baking process may be carried out using a convection oven, a proximity baking equipment, or the like.

Similarly, depending on the necessity, after the formation of the resist film pattern by the process described above, a hardening process using far ultraviolet ray irradiation may be applied to the resist film pattern for enhancing its thermal resistance.

Also, although the hot plate is stationary and the substrate is caused to move in the above explained embodiment, this may well be reversely arranged.

According to the invention, the varying temperature distribution is formed in the resist film during the thermal process so that, only by having a desired pattern exposed and subsequently developed, it is possible to form an opening in an undercut shape in the resist film which is useful as an underlying pattern in a lift-off process.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A method for thermally treating a resist film with a first surface formed on a substrate, said method comprising the steps of:

placing a heat source over a second surface of said resist film whereby a small space is left between said heat source and said second surface; and forming internally in said resist film a distribution of temperatures whereby the temperature in said resist film gradually decreases between said second surface of said resist film and a surface of said substrate.

2. A method for thermally treating a resist film according to claim 1, wherein said placing step is performed for a predetermined time period, and further comprising the step of moving said resist film and said heat source a predetermined distance apart from each other to locations at which said resist film is not influenced by said heat source after said predetermined time period has expired.

3. A method for thermally treating a resist film according to claim 2, in which one of said resist film and said heat source is kept stationary and the other is moved.

4. A method for thermally treating a resist film on a substrate and forming a resist pattern in said resist film according to claim 2, in which said predetermined distance between said resist film and said heat source is approximately 200 µm.

5. A method for thermally treating a resist film according to claim 1, further comprising the step of baking said resist film below a glass transition temperature of the resist film prior to thermally treating said resist film formed on said substrate.

6. A method for thermally treating a resist film with a first surface formed on a substrate and for forming a resist pattern in said resist film, said method comprising the steps of:

placing a heat source over a second surface of said resist film whereby a small space is left between said heat source and said second surface;

forming internally in said resist film a distribution of temperatures whereby the temperature in said resist film gradually decreases between said second surface of said resist film and a surface of said substrate;

forming a pattern of a predetermined form on said resist film by an exposure process; and developing said pattern thereby to form in said resist pattern an undercut which gradually increases its width towards the substrate.

7. A method for thermally treating a resist film on a substrate and for forming a resist pattern in said resist film according to claim 6, in which said pattern of a predetermined form is formed on said resist film by applying ultraviolet rays on said resist film.

8. A method for thermally treating a resist film on a substrate and for forming a resist pattern in said resist film according to claim 6, said method further comprising exposing far-ultraviolet rays on an entire surface of said resist film after said developing step, thereby to enhance thermal resistance characteristics of said resist pattern in an undercut form.

* * * * *